(12) United States Patent
Takakura et al.

(10) Patent No.: US 11,122,676 B2
(45) Date of Patent: Sep. 14, 2021

(54) FLEXIBLE WIRING CIRCUIT BOARD AND IMAGING DEVICE

(71) Applicant: NITTO DENKO CORPORATION, Osaka (JP)

(72) Inventors: Hayato Takakura, Osaka (JP); Yoshihiro Kawamura, Osaka (JP); Shuichi Wakaki, Osaka (JP); Shusaku Shibata, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/607,580

(22) PCT Filed: Apr. 25, 2018

(86) PCT No.: PCT/JP2018/016716
§ 371 (c)(1),
(2) Date: Oct. 23, 2019

(87) PCT Pub. No.: WO2018/199128
PCT Pub. Date: Nov. 1, 2018

(65) Prior Publication Data
US 2020/0154016 A1 May 14, 2020

(30) Foreign Application Priority Data

Apr. 28, 2017 (JP) .............................. JP2017-090167
Apr. 24, 2018 (JP) .............................. JP2018-083301

(51) Int. Cl.
*H05K 1/02* (2006.01)
*H05K 1/03* (2006.01)
(Continued)

(52) U.S. Cl.
CPC ......... *H05K 1/0218* (2013.01); *H05K 1/0393* (2013.01); *H05K 1/118* (2013.01);
(Continued)

(58) Field of Classification Search
CPC .... H05K 1/0218; H05K 1/0393; H05K 1/118; H05K 1/189; H05K 2201/0338; H05K 2021/10121
See application file for complete search history.

(56) References Cited

U.S. PATENT DOCUMENTS

2005/0139981 A1  6/2005 Kobayashi et al.
2008/0202807 A1* 8/2008 Wesselman .......... H05K 1/0221
                                                    174/388
(Continued)

FOREIGN PATENT DOCUMENTS

JP     2003-034828 A    2/2003
JP     2004-128158 A    4/2004
(Continued)

OTHER PUBLICATIONS

International Search Report Issued in PCT/JP2018/016716 dated Jul. 24, 2018.
(Continued)

*Primary Examiner* — Hoa C Nguyen
(74) *Attorney, Agent, or Firm* — Jean C. Edwards, Esq.; Edwards Neils LLC

(57) ABSTRACT

A flexible wiring circuit board includes a first insulating layer, a wire disposed at one side in a thickness direction of the first insulating layer, a second insulating layer disposed at one side in the thickness direction of the wire, a shield layer disposed at one side in the thickness direction of the second insulating layer, and a third insulating layer disposed at one side in the thickness direction of the shield layer. The shield layer includes an electrically conductive layer and two barrier layers sandwiching the electrically conductive layer therebetween in the thickness direction. The electrically conductive layer is selected from a metal belonging to a group 11, and the fourth period and the fifth period in the
(Continued)

periodic table, and the barrier layer is selected from a metal belonging to groups 4 to 10, and the fourth to the sixth periods in the periodic table.

10 Claims, 6 Drawing Sheets

(51) Int. Cl.
*H05K 1/11* (2006.01)
*H05K 1/18* (2006.01)
(52) U.S. Cl.
CPC ..... *H05K 1/189* (2013.01); *H05K 2201/0338* (2013.01); *H05K 2201/10121* (2013.01)

(56) References Cited

U.S. PATENT DOCUMENTS

| 2010/0304298 | A1 | 12/2010 | Hirashima et al. | |
|---|---|---|---|---|
| 2011/0120764 | A1* | 5/2011 | Kelley | H01L 23/573 174/377 |
| 2012/0188727 | A1* | 7/2012 | Lin | H01L 21/561 361/728 |
| 2013/0118788 | A1 | 5/2013 | Hishiki et al. | |
| 2015/0034364 | A1* | 2/2015 | Ho | H05K 1/0215 174/251 |
| 2016/0276307 | A1* | 9/2016 | Lin | H01L 23/552 |
| 2017/0245370 | A1* | 8/2017 | Wang | H05K 3/0011 |
| 2017/0301628 | A1* | 10/2017 | Kawabata | H01L 23/49838 |
| 2018/0211925 | A1* | 7/2018 | Tsai | H01L 23/552 |
| 2018/0315719 | A1* | 11/2018 | Kim | H01L 23/642 |

FOREIGN PATENT DOCUMENTS

| JP | 2004-207642 A | 7/2004 |
|---|---|---|
| JP | 07-179604 A | 8/2005 |
| JP | 2005-210628 A | 8/2005 |
| JP | 2007-243122 A | 9/2007 |
| JP | 2007-294918 A | 11/2007 |
| JP | 2010-276775 A | 12/2010 |
| JP | 2013-100441 A | 5/2013 |
| JP | 2017-059708 A | 3/2017 |
| TW | 201618609 A | 5/2016 |
| WO | 2016/204208 A1 | 12/2016 |
| WO | 2017/047072 A1 | 3/2017 |

OTHER PUBLICATIONS

Written Opinion Issued in PCT/JP2018/016716 dated Jul. 24, 2018.
International Preliminary Report on Patentability issued by WIPO dated Oct. 29, 2019, in connection with International Patent Application No. PCT/JP2018/016716.
Office Action, issued by the Taiwanese Patent Office dated Jun. 22, 2021, in connection with Taiwanese Patent Application No. 107114442.

* cited by examiner

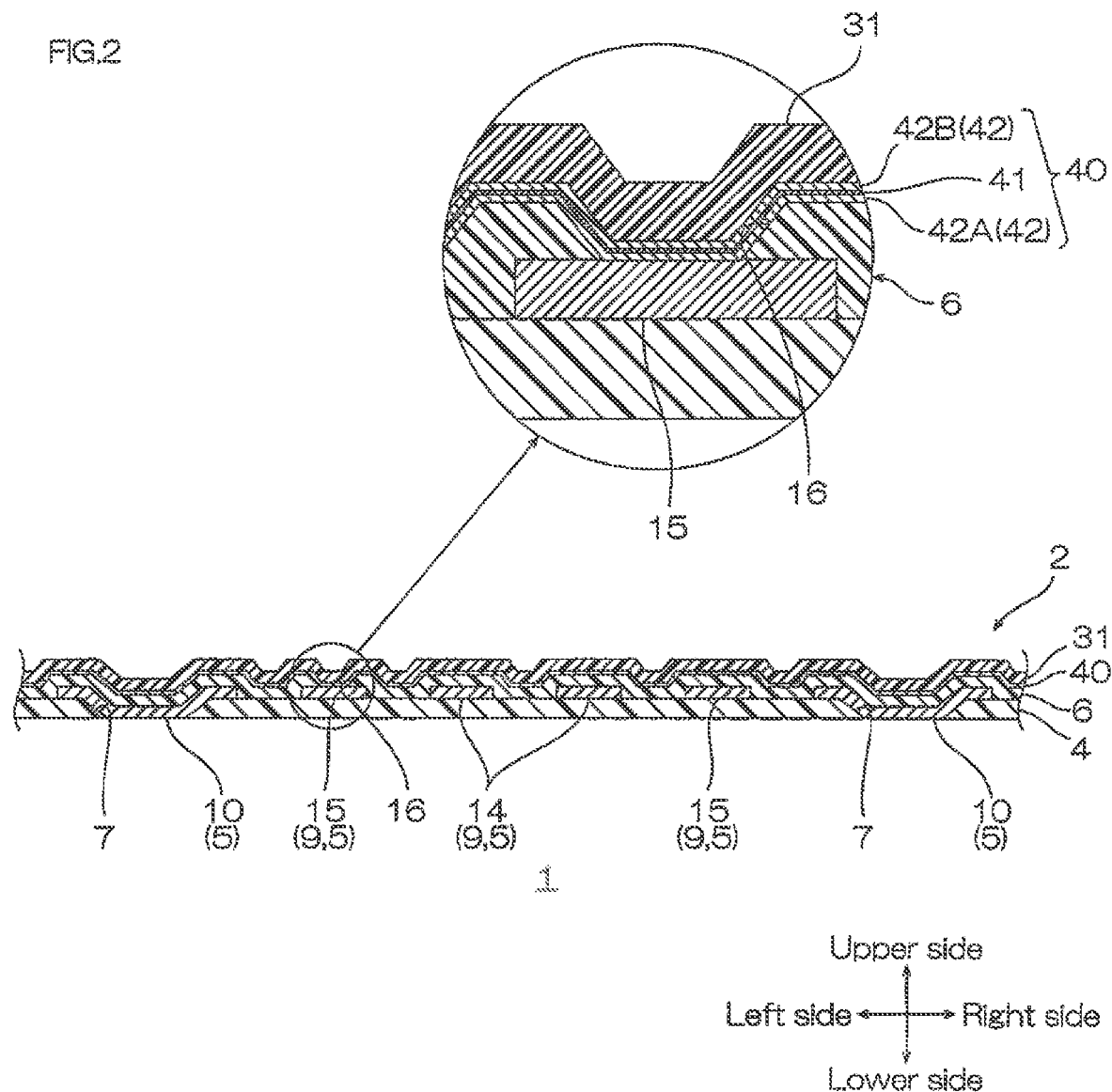

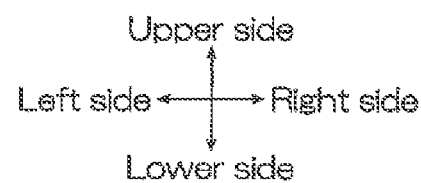
FIG.3A
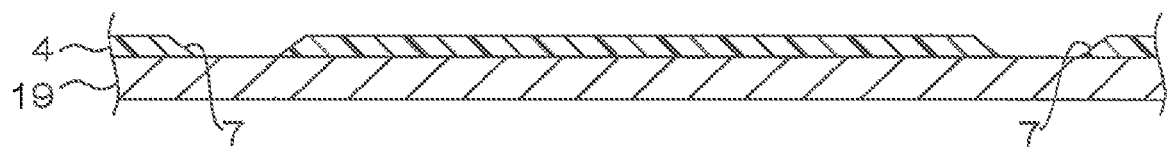
FIG.3B
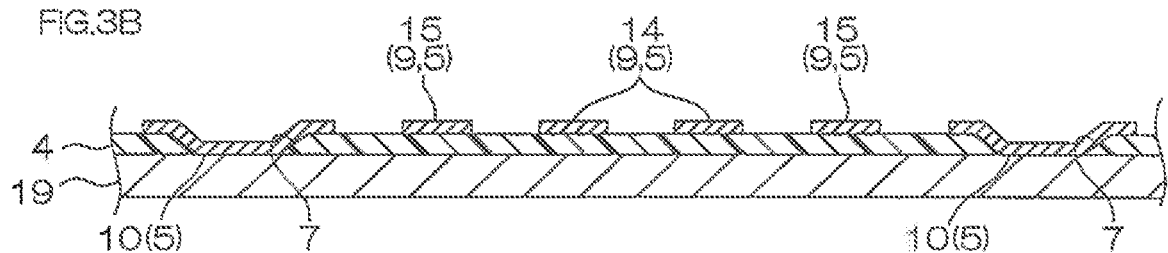
FIG.3C
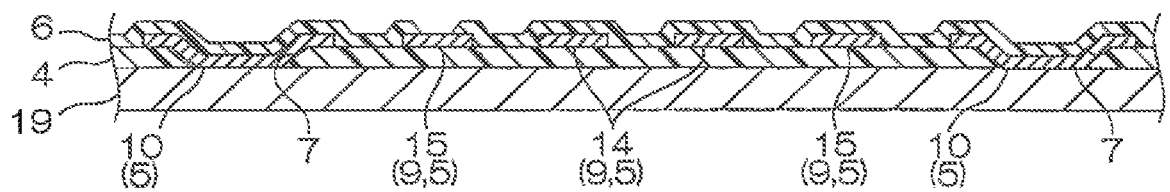

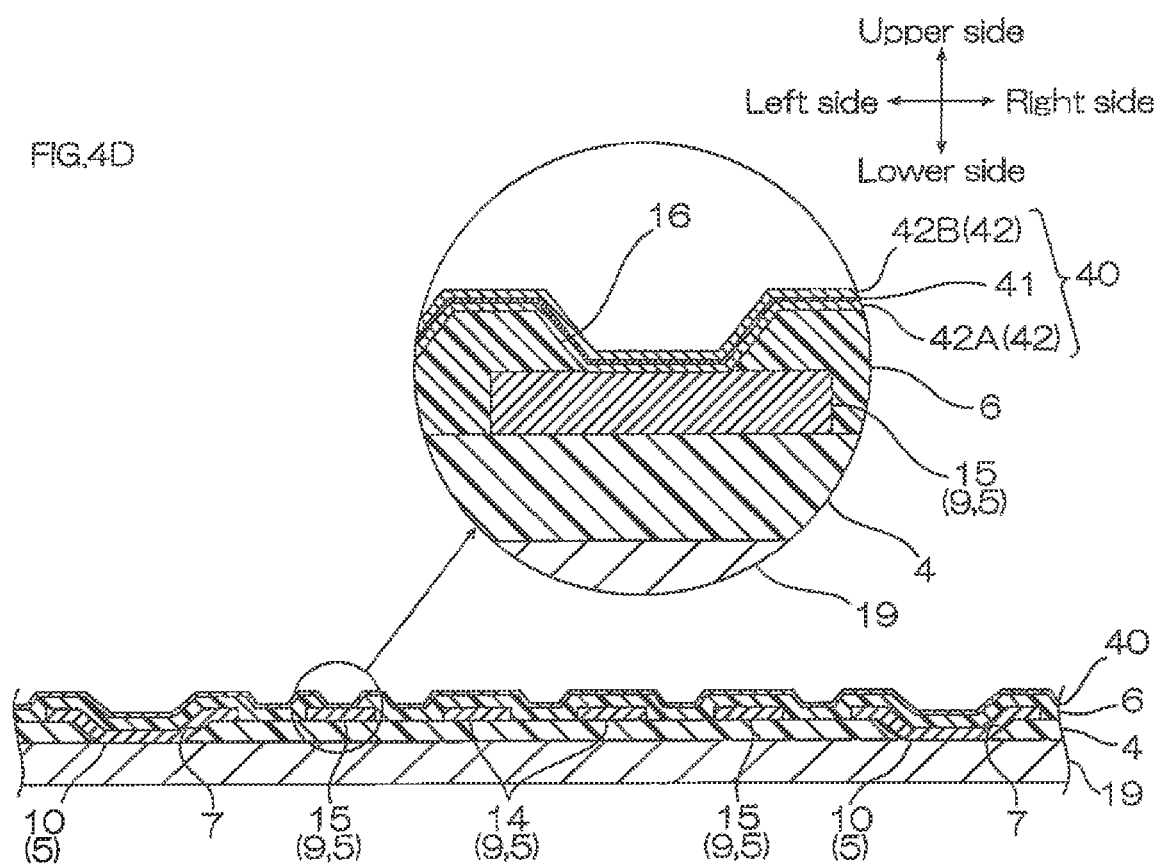
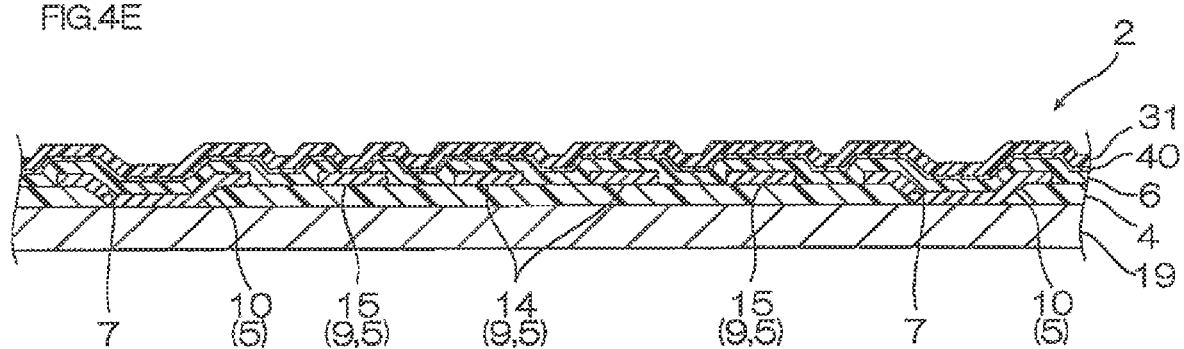
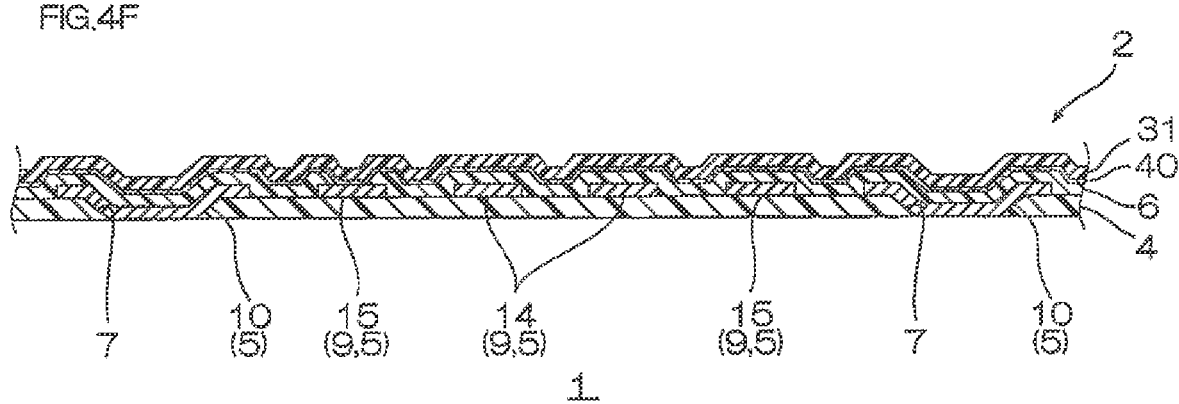

US 11,122,676 B2

FLEXIBLE WIRING CIRCUIT BOARD AND IMAGING DEVICE

CROSS-REFERENCE TO RELATED APPLICATIONS

The present application is a 35 U.S.C. 371 National Stage Entry of PCT/JP2018/016716, filed on Apr. 25, 2018, which claims priority from Japanese Patent Application No. 2017-090167, filed on Apr. 28, 2017, and Japanese Patent Application No. 2018-083301 filed on Apr. 24, 2018, the contents of all of which are herein incorporated by reference in their entirety.

TECHNICAL FIELD

The present invention relates to a flexible wiring circuit board and an imaging device.

BACKGROUND ART

Conventionally, it has been known that in a circuit board on which an electronic component is mounted, malfunction or noise of the electronic component is generated by the effect of electromagnetic waves from the outside. Thus, it is expected that a shield layer of the electromagnetic waves is provided in the circuit board, and the electromagnetic waves are shielded from the outside.

As such a shield layer, for example, a shield film including an adhesive film that is formed from SUS on a resin board, an electrically conductive film that is formed from Cu on the adhesive film, and a protecting film that is formed from SUS on the electrically conductive film has been proposed (ref: for example, Patent Document 1).

CITATION LIST

Patent Document

Patent Document 1: Japanese Unexamined Patent Publication No. 2007-243122

SUMMARY OF THE INVENTION

Problem to be Solved by the Invention

When the circuit board is a flexible wiring circuit board, the shield layer is required to have both excellent adhesive properties of not being peeled from the board even when the flexible wiring circuit board is deformed, and excellent shield properties with respect to the electromagnetic waves.

However, in the shield film of Patent Document 1, both the adhesive properties and the shield properties required in the flexible wiring circuit board cannot be sufficiently achieved.

The present invention provides a flexible wiring circuit board that is capable of achieving both excellent adhesive properties and excellent shield properties with respect to electromagnetic waves of a shield layer, and an imaging device.

Means for Solving the Problem

The present invention [1] includes a flexible wiring circuit board including a first insulating layer, a wire disposed at one side in a thickness direction of the first insulating layer, a second insulating layer disposed at one side in the thickness direction of the wire, a shield layer disposed at one side in the thickness direction of the second insulating layer, and a third insulating layer disposed at one side in the thickness direction of the shield layer, wherein the shield layer includes an electrically conductive layer and two barrier layers sandwiching the electrically conductive layer therebetween in the thickness direction; the electrically conductive layer is selected from a metal belonging to a group 11, and the fourth period and the fifth period in the periodic table; and the barrier layer is selected from a metal belonging to groups 4 to 10, and the fourth to the sixth periods in the periodic table.

According to the structure, each of the two barrier layers sandwiching the electrically conductive layer therebetween is selected from the metal belonging to groups 4 to 10, and the fourth to the sixth periods in the periodic table. Thus, compared to a case where the material for the barrier layer is stainless steel (SUS), the improvement of the adhesive properties and the shield properties of the shield layer can be achieved, and both excellent adhesive properties and excellent shield properties can be achieved.

The present invention [2] includes the flexible wiring circuit board described in the above-described [1], wherein each of the materials for the second insulating layer and the third insulating layer is a polyimide.

When the material for the second insulating layer and the third insulating layer is the polyimide, the metal that is the material for the shield layer tends to easily spread (migrate) in the polyimide.

Meanwhile, according to the above-described structure, the barrier layers sandwiching the electrically conductive layer therebetween is selected from the metal belonging to groups 4 to 10, and the fourth to the sixth periods in the periodic table. Thus, the spread (migration) of the metal that is the material for the shield layer in the second insulating layer and the third insulating layer whose materials are the polyimide can be suppressed.

The present invention [3] includes the flexible wiring circuit board described in the above-described [2], wherein the barrier layer is one metal selected from the group consisting of titanium, chromium, nickel, palladium, and tantalum.

According to the structure, the barrier layer is the metal selected from the above-described group. In the metal (the metal belonging to groups 4 to 10 and the fourth to the sixth periods in the periodic table) that is the material for the above-described barrier layer, the metal that belongs to the above-described group does not easily spread (migrate) particularly in the polyimide.

Thus, the spread (migration) of the metal that is the material for the barrier layer in the second insulating layer and the third insulating layer whose materials are the polyimide can be suppressed.

The present invention [4] includes the flexible wiring circuit board described in any one of the above-described [1] to [3], wherein the wire includes a ground wire, and the shield layer is electrically connected to the ground wire by bringing the barrier layer into contact with the ground wire.

According to the structure, the ground wire is disposed at one side in the thickness direction of the first insulating layer, so that there is no need for separately providing a layer for the ground wire. Thus, a reduction in thickness of the flexible wiring circuit board can be achieved.

The metal belonging to groups 4 to 10, and the fourth to the sixth periods in the periodic table that is the material for the barrier layer has lower volume resistivity than stainless steel, so that the shield layer can be efficiently grounded in a structure of bringing the barrier layer into contact with the ground wire.

The present invention [5] includes the flexible wiring circuit board described in any one of the above-described [1] to [4], wherein the wire is in direct contact with the first insulating layer, the second insulating layer is in direct contact with the wire, the barrier layer that is positioned at the other side in the thickness direction with respect to the electrically conductive layer is in direct contact with the second insulating layer, the electrically conductive layer is in direct contact with the barrier layer that is positioned at the other side in the thickness direction with respect to the electrically conductive layer, the barrier layer that is positioned at one side in the thickness direction with respect to the electrically conductive layer is in direct contact with the electrically conductive layer, and the third insulating layer is in direct contact with the barrier layer that is positioned at one side in the thickness direction with respect to the electrically conductive layer.

According to the structure, of the plurality of layers (the first insulating layer, the wire, the second insulating layer, the electrically conductive layer, the two barrier layers, and the third insulating layer), the layers that are next to each other in the thickness direction are in direct contact with each other.

That is, the layers that are next to each other in the thickness direction adhere to each other without an adhesive therebetween. Thus, a reduction in thickness of the flexible wiring circuit board can be achieved compared to a case where the layers that are next to each other in the thickness direction adhere to each other via the adhesive.

Among all, the barrier layer is selected from the above-described metal, so that excellent adhesive properties of the shield layer can be ensured, the shield layer can surely adhere to the second insulating layer and the third insulating layer without using the adhesive, and an adhesive-less flexible wiring circuit board can be achieved.

The present invention [6] includes the flexible wiring circuit board described in any one of the above-described [1] to [4] further including a fourth insulating layer and a second wire disposed between the wire and the second insulating layer in the thickness direction, wherein the fourth insulating layer is disposed at one side in the thickness direction of the wire and the second wire is disposed at one side in the thickness direction of the fourth insulating layer.

According to the structure, the flexible wiring circuit board includes the wire and the second wire, so that the number of the wire can be increased, and the improvement of a degree of freedom in design can be achieved.

The present invention [7] includes the flexible wiring circuit board described in any one of the above-described [1] to [6] being an imaging element-mounting board for mounting an imaging element.

According to the structure, the flexible wiring circuit board can achieve both excellent adhesive properties and excellent shield properties with respect to the electromagnetic waves of the shield layer, so that the flexible wiring circuit board can be preferably used as an imaging element-mounting board.

The present invention [8] includes an imaging device including the flexible wiring circuit board described in any one of the above-described [1] to [6] and an imaging element mounted on the flexible wiring circuit board.

According to the structure, the imaging device includes the above-described flexible wiring circuit board, so that both excellent adhesive properties and excellent shield properties with respect to the electromagnetic waves of the shield layer can be achieved.

Effect of the Invention

According to the flexible wiring circuit board and the imaging device of the present invention, both excellent adhesive properties and excellent shield properties with respect to the electromagnetic waves of the shield layer can be achieved.

BRIEF DESCRIPTION OF THE DRAWINGS

FIG. 2 shows an A-A cross-sectional view in the imaging element-mounting board shown in FIG. 1.

FIGS. 3A to 3C show production process views of the imaging element-mounting board shown in FIG. 2:

FIG. 3A illustrating a step of preparing a metal supporting body and a step of forming a base insulating layer, FIG. 3B illustrating a step of forming a conductive pattern, and FIG. 3C illustrating a step of forming a first cover insulating layer.

FIGS. 4D to 4F show production process views of the imaging element-mounting board subsequent to FIG. 3C:

FIG. 4D illustrating a step of forming a shield layer,

FIG. 4E illustrating a step of forming a second cover insulating layer, and

FIG. 4F illustrating a step of removing a metal supporting body.

DESCRIPTION OF EMBODIMENTS

Figure 1:
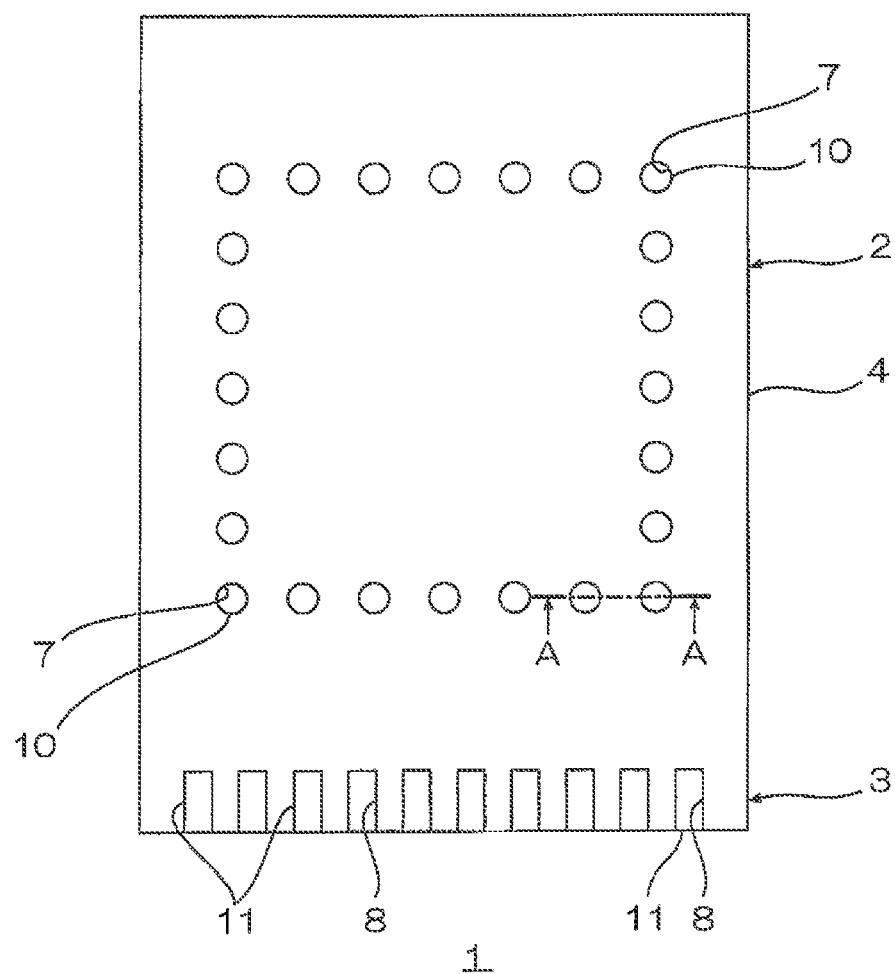
FIG. 1 shows a bottom view of an imaging element-mounting board that is one embodiment of a flexible wiring circuit board of the present invention.

In FIG. 1, the up-down direction on the plane of the sheet is a front-rear direction (first direction), the upper side on the plane of the sheet is a front side (one side in the first direction), and the lower side on the plane of the sheet is a rear side (the other side in the first direction).

In FIG. 1, the right-left direction on the plane of the sheet is a right-left direction (second direction perpendicular to the first direction), the left side on the plane of the sheet is a left side (one side in the second direction), and the right side on the plane of the sheet is a right side (the other side in the second direction).

In FIG. 1, the paper thickness direction on the plane of the sheet is an up-down direction (one example of a thickness direction, a third direction perpendicular to the first direction and the second direction), the far side on the plane of the sheet is an upper side (one example of one side in the thickness direction, one side in the third direction), and the near side on the plane of the sheet is a lower side (one example of the other side in the thickness direction, the other side in the third direction).

To be specific, directions are in conformity with direction arrows described in each view.

One Embodiment

1. Imaging Element-Mounting Board

An imaging element-mounting board 1 (hereinafter, may be simply referred to as a mounting board 1) that is one embodiment of a flexible wiring circuit board of the present invention is described.

Figure 5:
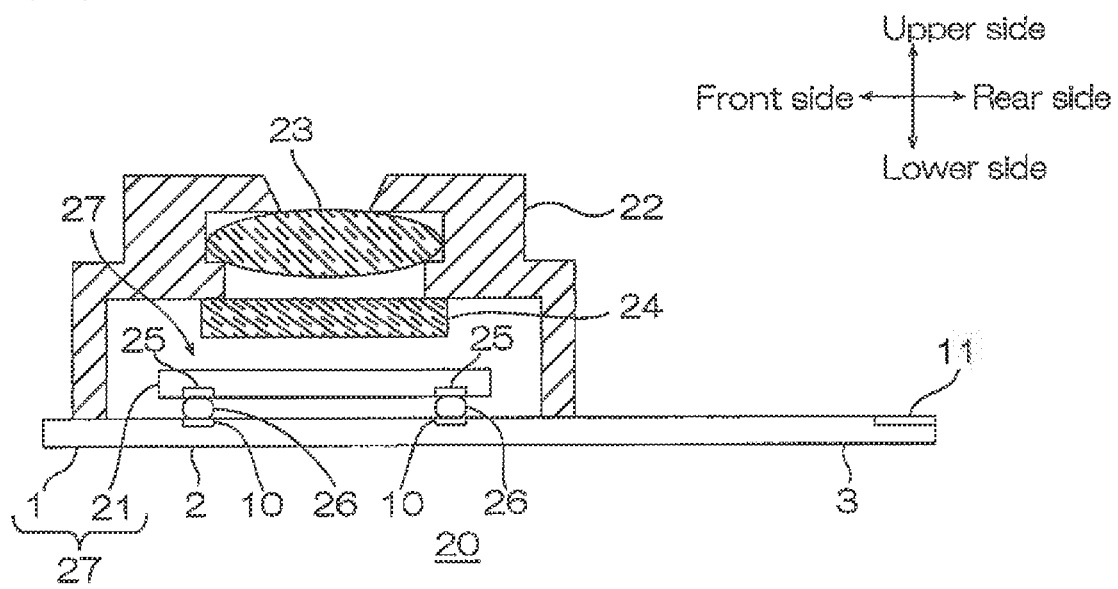
FIG. 5 shows an imaging device including the imaging element-mounting board shown in FIG. 2.

As shown in FIG. 1, the mounting board 1 is a flexible wiring circuit board (FPC) for mounting an imaging element 21 (described late, ref: FIG. 5), and does not include the imaging element 21 yet. The mounting board 1 has a generally rectangular (rectangle-shaped) flat plate shape (sheet shape) when viewed from the top extending in the front-rear direction and the right-left direction (plane direction).

The mounting board 1 includes a housing disposed portion 2 and an external component connecting portion 3.

The housing disposed portion 2 is a portion in which a housing 22 (described later, ref: FIG. 5) and the imaging element 21 are disposed. To be specific, in a case where the housing 22 is disposed in the mounting board 1, the housing disposed portion 2 is a portion that is overlapped with the housing 22 when projected in the thickness direction. A plurality of imaging element connecting terminals 10 (described later) for being electrically connected to the imaging element 21 are disposed in a generally central portion of the housing disposed portion 2.

The external component connecting portion 3 is a region other than the housing disposed portion 2, and a portion for being connected to an external component. The external component connecting portion 3 is disposed at the rear side of the housing disposed portion 2 so that the front end edge thereof is continuous to the rear end edge of the housing disposed portion 2. In the rear end edge of the external component connecting portion 3, a plurality of external component connecting terminals 11 (described later) for being electrically connected to the external component are disposed.

As shown in FIG. 2, the mounting board 1 sequentially includes a base insulating layer 4 as one example of a first insulating layer, a conductive pattern 5, a first cover insulating layer 6 as one example of a second insulating layer, a shield layer 40, and a second cover insulating layer 31 as one example of a third insulating layer upwardly (one example of one side in the thickness direction).

As shown in FIGS. 1 and 2, the base insulating layer 4 forms the outer shape of the mounting board 1, and has a generally rectangular shape when viewed from the bottom. The base insulating layer 4 is positioned at the lowermost layer of the mounting board 1. The lower surface (one example of the other-side surface in the thickness direction) of the base insulating layer 4 is formed flat. The entire lower surface of the base insulating layer 4 is exposed downwardly. To be more specific, the lower surface of the base insulating layer 4 is not supported by a metal supporting body (ref: a code 19 of FIGS. 3A to 4E), and accordingly, the mounting board 1 does not include the metal supporting body 19 (metal supporting layer).

As shown in FIG. 1, in the base insulating layer 4, a plurality of imaging element opening portions 7 and a plurality of external component opening portions 8 are formed.

The plurality of imaging element opening portions 7 are opening portions for exposing the imaging element connecting terminals 10 from the lower surface. The plurality of imaging element opening portions 7 are disposed in alignment at spaced intervals to each other so as to have rectangular frame shapes in the central portion of the housing disposed portion 2. As shown in FIG. 2, each of the plurality of imaging element opening portions 7 has a generally circular shape when viewed from the bottom passing through the base insulating layer 4 in the up-down direction. The imaging element opening portion 7 has a tapered shape in which the opening cross-sectional area decreases as it is closer to the lower side.

As shown in FIG. 1, the plurality of external component opening portions 8 are opening portions for exposing the external component connecting terminals 11 from the lower surface. The external component opening portions 8 are disposed in alignment at spaced intervals to each other in the right-left direction in the rear end edge of the external component connecting portion 3. Each of the plurality of external component opening portions 8 has a generally rectangular shape (rectangle-shaped) when viewed from the bottom passing through the base insulating layer 4 in the up-down direction. The external component opening portion 8 is formed so as to extend from the rear end edge of the external component connecting portion 3 forwardly when viewed from the bottom.

Examples of a material for the base insulating layer 4 include insulating materials. Examples of the insulating material include synthetic resins such as polyimide, polyamide imide, acryl, polyether nitrile, polyether sulfone, polyethylene terephthalate, polyethylene naphthalate, and polyvinyl chloride. As the insulating material, preferably, in view of insulating properties, heat resistance, and chemical resistance, a polyimide is used.

To be specific, examples of the polyimide include materials described in Japanese Unexamined Patent Publications No. H07-179604, No. 2010-276775, and No. 2013-100441.

The base insulating layer 4 has a thickness of, for example, 30 μm or less, preferably 12 μm or less, more preferably, 8 μm or less, and for example, 1 μm or more, preferably 3 μm or more.

As shown in FIG. 2, the conductive pattern 5 is disposed at the upper side (one side in the thickness direction) of the base insulating layer 4 so as to be in contact with the upper surface of the base insulating layer 4. The conductive pattern 5 includes the plurality of imaging element connecting terminals 10, the plurality of external component connecting terminals 11 (ref: FIG. 1), and a plurality of wires 9.

As shown in FIG. 1, the plurality of imaging element connecting terminals 10 are disposed in alignment at spaced intervals to each other so as to be in rectangular frame shapes in the central portion of the housing disposed portion 2. That is, the plurality of imaging element connecting terminals 10 are provided so as to correspond to a plurality of terminals 25 (ref: FIG. 5) of the imaging element 21 to be mounted. The plurality of imaging element connecting terminals 10 are provided corresponding to the plurality of imaging element opening portions 7. Each of the plurality of imaging element connecting terminals 10 has a generally circular shape when viewed from the bottom. The imaging element connecting terminal 10 is disposed at the inside of the imaging element opening portion 7, and formed so as to protrude downwardly when viewed in cross section (in side cross section and in front cross section). The lower surface of the imaging element connecting terminal 10 is exposed from the imaging element opening portion 7.

As shown in FIG. 1, the plurality of external component connecting terminals 11 are disposed in alignment at spaced intervals to each other in the right-left direction in the rear end edge of the external component connecting portion 3. That is, the plurality of external component connecting terminals 11 are provided so as to correspond to a plurality of terminals (not shown) of the external component. The plurality of external component connecting terminals 11 are provided corresponding to the plurality of external component opening portions 8. Each of the plurality of external component connecting terminals 11 has a generally rectangular shape (rectangle-shaped) when viewed from the top. The external component connecting terminal 11 is disposed at the inside of the external component opening portion 8, and the lower surface thereof is exposed from the external component opening portion 8.

As shown in FIG. 2, the plurality of wires 9 are disposed at the upper side (one side in the thickness direction) of the base insulating layer 4, and in direct contact with the upper surface of the base insulating layer 4. The plurality of wires 9 include a plurality of connecting wires 14 and a plurality of ground wires 15.

The plurality of connecting wires 14 are provided so as to correspond to the plurality of imaging element connecting terminals 10 and the plurality of external component connecting terminals 11. To be specific, though not shown, the connecting wire 14 is integrally formed with the imaging element connecting terminal 10 and the external component connecting terminal 11 so as to connect the imaging element connecting terminal 10 to the external component connecting terminal 11. That is, one end of the connecting wire 14 is continuous to the imaging element connecting terminal 10, and the other end thereof is continuous to the external component connecting terminal 11, so that the imaging element connecting terminal 10 is electrically connected to the external component connecting terminal 11.

The plurality of ground wires 15 are provided at the outer side of the plurality of connecting wires 14 along them. A ground terminal that is not shown is integrally connected to one end of the ground wire 15.

Examples of a material for the conductive pattern 5 include metal materials such as copper silver, gold, and nickel, and an alloy thereof, and solder. Preferably, copper is used.

The conductive pattern 5 has a thickness of, for example, 1 µm or more, preferably 3 µm or more, and for example, 15 µm or less, preferably 10 µm or less. The wire 9 has a width of for example, 5 µm or more, preferably 10 µm or more, and for example, 100 µm or less, preferably 50 µm or less.

The first cover insulating layer 6 is disposed at the upper side of the base insulating layer 4 and the conductive pattern 5 so as to cover the conductive pattern 5. That is, the first cover insulating layer 6 is disposed so as to be in contact with the upper surface and the side surfaces of the conductive pattern 5, and a portion that is exposed from the conductive pattern 5 on the upper surface of the base insulating layer 4. That is, at least a part of the first cover insulating layer 6 is disposed at the upper side (one side in the thickness direction) of the conductive pattern 5 (the plurality of imaging element connecting terminals 10, the plurality of external component connecting terminals 11, and the plurality of wires 9), and in direct contact with the conductive pattern 5 (the plurality of imaging element connecting terminals 10, the plurality of external component connecting terminals 11, and the plurality of wires 9). The outer shape of the first cover insulating layer 6 is formed so as to be the same as that of the base insulating layer 4.

A ground opening portion 16 is formed in the first cover insulating layer 6. The ground opening portion 16 is an opening portion for exposing the upper surface of the ground wire 15. The ground opening portion 16 is formed corresponding to the ground wire 15. The ground opening portion 16 passes through the first cover insulating layer 6 in the up-down direction, and exposes the upper surface of the ground wire 15. The ground opening portion 16 has a tapered shape in which the opening cross-sectional area decreases as it is closer to the lower side.

Examples of a material for the first cover insulating layer 6 include the same insulating materials as those of the base insulating layer 4 described above. Preferably, the polyimide is used.

The first cover insulating layer 6 has a thickness of; for example, 30 µm or less, preferably 10 µm or less, more preferably 5 µm or less, and for example, 1 µm or more, preferably 2 µm or more.

The shield layer 40 is a shield for shielding electromagnetic waves, and disposed at the upper side (one side in the thickness direction) of the first cover insulating layer 6 so as to be in contact with the upper surface of the first cover insulating layer 6. In the embodiment, the shield layer 40 has a sheet shape extending in the plane direction (the front-rear direction and the right-left direction). The outer shape of the shield layer 40 is formed so as to be the same as that of the first cover insulating layer 6. That is, the shield layer 40 is provided so as to be collectively in contact with the entire upper surface of the first cover insulating layer 6 and the entire upper surface of the ground wire 15 that is exposed from the ground opening portion 16.

The shield layer 40 includes an electrically conductive layer 41, and two barrier layers 42 that sandwich the electrically conductive layer 41 therebetween in the up-down direction (thickness direction). Preferably, the shield layer 40 consists of the electrically conductive layer 41 and the two barrier layers 42. In the following, when the two barrier layers 42 are distinguished from each other, the barrier layer 42 that is positioned at the lower side (the other side in the thickness direction) with respect to the electrically conductive layer 41 is defined as a first barrier layer 42A, and the barrier layer 42 that is positioned at the upper side (one side in the thickness direction) with respect to the electrically conductive layer 41 is defined as a second barrier layer 42B.

The electrically conductive layer 41 is a layer for shielding the electromagnetic waves, and disposed between the first barrier layer 42A and the second barrier layer 42B in the up-down direction. To be more specific, the electrically conductive layer 41 is in direct contact with the upper surface of the first barrier layer 42A, and in direct contact with the lower surface of the second barrier layer 42B. The electrically conductive layer 41 has a sheet shape extending in the plane direction (the front-rear direction and the right-left direction). The electrically conductive layer 41 is preferably a sputtering film that is formed by sputtering.

The electrically conductive layer 41 is selected from a metal belonging to a group 11, and the fourth period and the fifth period in the periodic table. That is, the electrically conductive layer 41 is formed from at least one of the metals (copper and silver) belonging to a group 11, and the fourth period and the fifth period in the periodic table. The periodic table is in conformity with IUPAC Periodic Table of the Elements (version dated 28 Nov. 2016). As the metal that is the material for the electrically conductive layer 41, preferably, a pure metal of copper or silver is used, more preferably copper is used.

The electrically conductive layer 41 has higher electrical conductivity than the barrier layer 42. That is, the volume resistivity of the electrically conductive layer 41 is lower than that of the barrier layer 42. The volume resistivity (at 0° C.) of the electrically conductive layer 41 is, for example, 1.6 µΩ·cm or less, and for example, 1.0 µΩ·cm or more. The volume resistivity is measured by a four-point probe method.

When the volume resistivity of the electrically conductive layer 41 is the above-described upper limit or less, the improvement of the shield properties of the shield layer 40 can be surely achieved.

The electrically conductive layer 41 has a thickness of for example, 1.0 µm or less, preferably 0.3 µm or less, and for example, 0.05 µm or more.

When the thickness of the electrically conductive layer 41 is the above-described upper limit or less, a reduction in thickness of the mounting board 1 can be surely achieved. When the thickness of the electrically conductive layer 41 is the above-described lower limit or more, the improvement of the shield properties of the shield layer 40 can be surely achieved.

The two barrier layers 42 are layers for suppressing the spread (migration) of the metal that is the material for the electrically conductive layer 41 in the insulating layer. To be more specific, the first barrier layer 42A is a layer for suppressing the spread (migration) of the metal that is the material for the electrically conductive layer 41 in the first cover insulating layer 6. The second barrier layer 42B is a layer for suppressing the spread (migration) of the metal that is the material for the electrically conductive layer 41 in the second cover insulating layer 31.

The first barrier layer 42A is disposed between the first cover insulating layer 6 and the electrically conductive layer 41, and between a portion that is exposed from the ground opening portion 16 on the ground wire 15 and the electrically conductive layer 41 in the up-down direction. The first barrier layer 42A is disposed at the upper side (one side in the thickness direction) of the first cover insulating layer 6 so as to be in direct contact with the upper surface of the first cover insulating layer 6, and disposed at the upper side of the ground wire 15 so as to be in direct contact with a portion that is exposed from the ground opening portion 16 on the upper surface of the ground wire 15.

The second barrier layer 42B is disposed between the electrically conductive layer 41 and the second cover insulating layer 31 in the up-down direction. The second barrier layer 42B is disposed at the upper side (one side in the thickness direction) of the electrically conductive layer 41 so as to be in direct contact with the upper surface of the electrically conductive layer 41.

Each of the barrier layers 42 (each of the first barrier layer 42A and the second barrier layer 42B) has a sheet shape extending in the plane direction (the front-rear direction and the right-left direction). The barrier layer 42 is preferably a sputtering film formed by sputtering.

Each of the barrier layers 42 (each of the first barrier layer 42A and the second barrier layer 42B) is selected from the metal belonging to the groups 4 to 10, and the fourth to the sixth periods in the periodic table. That is, the barrier layer 42 is formed from one pure metal selected from the group consisting of the metal (titanium, vanadium, chromium, manganese, iron, cobalt, nickel, zirconium, niobium, molybdenum, technetium, ruthenium, rhodium, palladium, hafnium, tantalum, tungsten, rhenium, osmium, iridium, and platinum) belonging to groups 4 to 10, and the fourth to the sixth periods in the periodic table.

As the metal that is the material for the barrier layer 42, preferably, one metal (pure metal) selected from the group consisting of titanium, chromium, nickel, palladium, and tantalum is used, more preferably, a pure metal of titanium and chromium is used.

When the metal that is the material for the barrier layer 42 is the metal selected from the above-described group, even in a case where the materials for the first cover insulating layer 6 and the second cover insulating layer 31 are the polyimide, the spread (migration) of the metal in the first cover insulating layer 6 and the second cover insulating layer 31 can be surely suppressed.

The metal that is the material for the first barrier layer 42A and the metal that is the material for the second barrier layer 42B may be different from each other or may be the same.

As a combination of the metal that is the material for the electrically conductive layer 41 and the metal that is the material for the barrier layer 42, preferably, a combination of copper or silver (the electrically conductive layer 41) and titanium (the barrier layer 42), a combination of copper or silver (the electrically conductive layer 41) and chromium (the barrier layer 42), a combination of copper or silver (the electrically conductive layer 41) and nickel (the barrier layer 42), a combination of copper or silver (the electrically conductive layer 41) and palladium (the barrier layer 42), and a combination of coper copper or silver (the electrically conductive layer 41) and tantalum (the barrier layer 42) are used, more preferably, a combination of copper and titanium and a combination of copper and chromium are used.

When the combination of the metal that is the material for the electrically conductive layer 41 and the metal that is the material for the barrier layer 42 is the above-described combination, both excellent adhesive properties and excellent shield properties with respect to the electromagnetic waves of the shield layer 40 can be surely achieved.

When the metal that is the material for the first barrier layer 42A and the metal that is the material for the second barrier layer 42B are different from each other, as a combination of the metal that is the material for the first barrier layer 42A, the metal that is the material for the electrically conductive layer 41, and the metal that is the material for the second barrier layer 42B, preferably, a combination of chromium (the first barrier layer 42A), copper or silver (the electrically conductive layer 41), and nickel (the second barrier layer 42B), a combination of titanium (the first barrier layer 42A), copper or silver (the electrically conductive layer 41), and nickel (the second barrier layer 42B), and a combination of chromium (the first barrier layer 42A), copper or silver (the electrically conductive layer 41), and palladium (the second barrier layer 42B) are used, more preferably, a combination of chromium (the first barrier layer 42A), copper or silver (the electrically conductive layer 41), and nickel (the second barrier layer 42B) is used.

The volume resistivity (at 0° C.) of the barrier layer 42 is, for example, 50 µΩ·cm or less, preferably 20 µΩ·cm or less, more preferably 15 µΩ·cm or less, and for example, 1.8 µΩ·cm or more.

When the volume resistivity of the barrier layer 42 is the above-described upper limit or less, the electrical conductivity of the barrier layer 42 can be ensured, and the improvement of the shield properties of the shield layer 40 can be furthermore achieved.

When the thickness of the electrically conductive layer 41 is 100, the thickness of the barrier layer 42 is, for example, 10 or more, preferably 20 or more. The barrier layer 42 has a thickness of, for example, 1.0 µm or less, preferably 0.09 µm or less, more preferably 0.08 µm or less, particularly preferably 0.05 µm or less, and for example, 0.01 µm or more, preferably 0.02 µm or more.

When the thickness of the barrier layer 42 is the above-described upper limit or less, a reduction in thickness of the mounting board 1 can be surely achieved, and when the thickness of the barrier layer 42 is the above-described lower limit or more, the spread (migration) of the metal that is the material for the electrically conductive layer 41 in the insulating layer can be surely suppressed, and the improvement of the adhesive properties of the shield layer 40 can be surely achieved.

As described above, the barrier layer 42 (the first barrier layer 42A) is brought into contact with the ground wire 15, so that the shield layer 40 is electrically connected to the ground wire 15. That is, the shield layer 40 is continuous to the ground wire 15. To be specific, the shield layer 40 has a protruding shape downwardly so as to be in contact with the upper surface of the ground wire 15 via the ground opening portion 16 in a portion that faces the ground wire 15. In this manner, the shield layer 40 is grounded via the ground wire 15.

The second cover insulating layer 31 is disposed at the upper side (one side in the thickness direction) of the shield layer 40 so as to cover the shield layer 40. The lower surface of the second cover insulating layer 31 is in direct contact with the upper surface of the second barrier layer 42B. The second cover insulating layer 31 is positioned at the uppermost layer of the mounting board 1, and the upper surface of the second cover insulating layer 31 is exposed upwardly. The outer shape of the second cover insulating layer 31 is formed so as to be the same as that of the shield layer 40.

Examples of a material for the second cover insulating layer 31 include the same insulating materials as those of the first cover insulating layer 6 described above. Preferably, the polyimide is used. That is, each of the materials for the first cover insulating layer 6 and the second cover insulating layer 31 is preferably the polyimide.

The range of the thickness of the second cover insulating layer 31 is, for example, the same as that of the thickness of the first cover insulating layer 6.

In the embodiment, in the mounting board 1, of the plurality of layers (the base insulating layer 4, the conductive pattern 5, the first cover insulating layer 6, the shield layer 40, and the second cover insulating layer 31), the layers that are next to each other in the thickness direction are in direct contact with each other, and adhere to each other without an adhesive between the layers. That is, the mounting board 1 is an adhesive-less FPC without using the adhesive. Thus, a reduction in thickness of the mounting board 1 can be achieved.

In the mounting board 1, the total sum of the thickness of the shield layer 40 and the thickness of the second cover insulating layer 31 is, for example, 15.0 µm or less, preferably 10 µm or less, more preferably 5 µm or less, and for example, 1 µm or more.

The mounting board 1 has a thickness (the total sum of the thickness of the base insulating layer 4, the conductive pattern 5, the first cover insulating layer 6, the shield layer 40, and the second cover insulating layer 31) of, for example, 50 µm or less, preferably 25 µm or less, more preferably 20 µm or less, and for example, 3 µm or more.

2. Method for Producing Imaging Element-Mounting Board

As shown in FIGS. 3A to 4F, the mounting board 1 is, for example, obtained by sequentially carrying out a metal supporting body preparing step, a base insulating layer forming step, a conductive pattern forming step, a first cover insulating layer forming step, a shield layer forming step, a second cover insulating layer forming step, and a metal supporting body removing step.

As shown in FIG. 3A, in the metal supporting body preparing step, the metal supporting body 19 is prepared.

The metal supporting body 19 has a generally rectangular (rectangle-shaped) flat plate shape (sheet shape) when viewed from the top extending in the plane direction. The upper surface of the metal supporting body 19 is formed flat (smooth).

Examples of the material for the metal supporting body 19 include metal materials such as stainless steel, 42-alloy, and aluminum. Preferably, stainless steel is used.

The metal supporting body 19 has a thickness of, for example, 5 µm or more, preferably 10 µm or more, and for example, 50 µm or less, preferably 30 µm or less.

Subsequently, in the base insulating layer forming step, the base insulating layer 4 is formed on the upper surface of the metal supporting body 19. That is, the base insulating layer 4 having the imaging element opening portion 7 and the external component opening portion 8 is formed on the upper surface of the metal supporting body 19.

To be specific, a varnish of a photosensitive insulating material (for example, polyimide) is applied to the entire upper surface of the metal supporting body 19 to be dried, so that a base film (base insulating layer) is formed. Thereafter, the base film is exposed to light via a photomask having a pattern corresponding to the opening portions (the imaging element opening portion 7 and the external component opening portion 8). Thereafter, the base film is developed, and is preferably cured by heating.

Subsequently, as shown in FIG. 3B, in the conductive pattern forming step, the conductive pattern 5 is formed on the upper surface of the base insulating layer 4 and a portion that is exposed from the imaging element opening portion 7 and the external component opening portion 8 on the upper surface of the metal supporting body 19 in the above-described pattern by, for example, an additive method or the like.

Subsequently, as shown in FIG. 3C, in the first cover insulating layer forming step, the first cover insulating layer 6 is formed on the upper surface of the base insulating layer 4 so as to cover the conductive pattern 5. That is, the first cover insulating layer 6 having the ground opening portion 16 is formed on the upper surface of the base insulating layer 4. The first cover insulating layer forming step is carried out in the same manner as that of the base insulating layer forming step.

Subsequently, as shown in FIG. 4D, in the shield layer forming step, the shield layer 40 is formed on the entire upper surface of the first cover insulating layer 6 and the entire upper surface of the ground wire 15 that is exposed from the ground opening portion 16.

To be more specific, the shield layer forming step sequentially includes a first barrier layer forming step, an electrically conductive layer forming step, and a second barrier layer forming step.

In the first barrier layer forming step, the first barrier layer 42A is collectively formed on the entire upper surface of the first cover insulating layer 6 and the entire upper surface of the ground wire 15 that is exposed from the ground opening portion 16. As a forming method of the first barrier layer 42A, for example, a known thin film forming method such as sputtering, evaporation, and plating is used. Preferably, sputtering is used.

In the electrically conductive layer forming step, the electrically conductive layer 41 is formed on the entire upper surface of the first barrier layer 42A. An example of the forming method of the electrically conductive layer 41 includes the same forming method as that of the first barrier layer 42A, and preferably, the sputtering is used.

In the second barrier layer forming step, the second barrier layer 42B is formed on the entire upper surface of the electrically conductive layer 41. An example of the forming method of the second barrier layer 42B includes the same forming method as that of the first barrier layer 42A, and preferably, the sputtering is used.

In this manner, the shield layer 40 including the first barrier layer 42A, the electrically conductive layer 41, and the second barrier layer 42B is formed.

Subsequently, as shown in FIG. 4E, in the second cover insulating layer forming step, the second cover insulating layer 31 is formed on the entire upper surface of the shield layer 40 (the second barrier layer 42B). The second cover insulating layer forming step is carried out in the same manner as that of the base insulating layer forming step.

In the second cover insulating layer forming step, when the second cover insulating layer 31 is cured by heating, the metal that is the material for the electrically conductive layer 41 may be spread (migrated) in the first cover insulating layer 6 and the second cover insulating layer 31. Meanwhile, in the mounting board 1, the first barrier layer 42A is positioned between the first cover insulating layer 6 and the electrically conductive layer 41, and the second barrier layer 42B is positioned between the electrically conductive layer 41 and the second cover insulating layer 31, so that the spread (migration) of the metal of the electrically conductive layer 41 in the first cover insulating layer 6 and the second cover insulating layer 31 can be suppressed.

As describe above, the mounting board 1 including the base insulating layer 4, the conductive pattern 5, the first cover insulating layer 6, the shield layer 40, and the second cover insulating layer 31 is obtained in a state of being supported by the metal supporting body 19. The mounting board 1 includes the metal supporting body 19, and is not yet removed. Thus, the mounting board 1 is not included in the flexible wiring circuit board of the present invention.

As shown in FIG. 4F, in the metal supporting body removing step, the metal supporting body 19 is removed.

As a removing method of the metal supporting body 19, for example, a method of peeling the metal supporting body 19 from the lower surface of the base insulating layer 4, a portion that is exposed from the imaging element opening portion 7 on the lower surface of the imaging element connecting terminal 10, and a portion that is exposed from the external component opening portion 8 on the lower surface of the external component connecting terminal 11 and a method of applying etching such as dry etching and wet etching to the metal supporting body 19 are used. As the removing method of the metal supporting body 19, preferably, etching is used, more preferably, wet etching is used.

In this manner, the metal supporting body 19 is removed, so that the mounting board 1 including the base insulating layer 4, the conductive pattern 5, the first cover insulating layer 6, the shield layer 40, and the second cover insulating layer 31 is obtained. The mounting board 1 does not include the metal supporting body 19, and preferably consists of the base insulating layer 4, the conductive pattern 5, the first cover insulating layer 6, the shield layer 40, and the second cover insulating layer 31.

The mounting board 1 is, for example, used in an imaging element-mounting board for mounting an imaging element. That is, the mounting board 1 is provided in an imaging device such as camera module. The mounting board 1 is not the imaging device to be described next, and is one component of the imaging device, that is, a component for producing the imaging device. The mounting board 1 does not include an imaging element, and to be specific, is an industrially available device whose component alone is circulated.

3. Imaging Device

Next, an imaging device 20 including the mounting board 1 is described with reference to FIG. 5.

The imaging device 20 includes the mounting board 1, the imaging element 21, the housing 22, an optical lens 23, and a filter 24.

The mounting board 1 shown in FIG. 2 is reversed upside down to be provided in the imaging device 20. That is, the mounting board 1 is disposed so that the base insulating layer 4 is the upper side (the other side in the thickness direction) and the second cover insulating layer 31 is the lower side (one side in the thickness direction).

The imaging element 21 is a semiconductor element that converts light to electrical signals, and examples thereof include solid imaging elements such as CMOS sensor and CCD sensor. The imaging element 21 has a generally rectangular flat plate shape when viewed from the top, and though not shown, includes a silicon such as Si board, and a photo diode (photoelectric converting element) and a color filter that are disposed thereon. The plurality of terminals 25 corresponding to the imaging element connecting terminal 10 of the mounting board 1 are provided on the lower surface of the imaging element 21. The imaging element 21 has a thickness of, for example, 10 μm or more, preferably 50 μm or more, and for example, 1000 μm or less, preferably 500 μm or less.

The imaging element 21 is mounted on the mounting board 1. To be specific, the terminal 25 of the imaging element 21 is flip-chip mounted on the corresponding imaging element connecting terminal 10 of the mounting board 1 via a solder bump 26 or the like. In this manner, the imaging element 21 is disposed in the central portion of the housing disposed portion 2 of the mounting board 1 to be electrically connected to the imaging element connecting terminal 10 and the external component connecting terminal 11 of the mounting board 1.

The imaging element 21 is mounted on the mounting board 1 to constitute an imaging unit 27. That is, the imaging unit 27 includes the mounting board 1 and the imaging element 21 that is mounted thereon.

The housing 22 is disposed in the housing disposed portion 2 of the imaging element 21 at spaced intervals to the imaging element 21 so as to surround it. The housing 22 has a generally rectangular cylindrical shape when viewed from the top. In the upper end of the housing 22, a fixing portion for fixing the optical lens 23 is provided.

The optical lens 23 is disposed at the upper side of the mounting board 1 at spaced intervals to the mounting board 1 and the imaging element 21. The optical lens 23 has a generally circular shape when viewed from the top, and is fixed by the fixing portion so that light from the outside reaches the imaging element 21.

The filter 24 is disposed in the center in the up-down direction of the imaging element 21 and the optical lens 23 at spaced intervals thereto, and fixed to the housing 22.

As shown in FIG. 2, the shield layer 40 of the mounting board 1 includes the electrically conductive layer 41 and the two barrier layers 42 that sandwich the electrically conductive layer 41 therebetween in the up-down direction. The barrier layer 42 is selected from the metal belonging to groups 4 to 10, and the fourth to the sixth periods in the periodic table. Thus, compared to a case where the material for the barrier layer 42 is stainless steel (SUS), the improvement of the adhesive properties and the shield properties of the shield layer 40 can be achieved, and both excellent adhesive properties and excellent shield properties can be achieved.

Each of the materials for the first cover insulating layer 6 and the second cover insulating layer 31 is preferably the polyimide. When the material for the first cover insulating layer 6 and the second cover insulating layer 31 is the polyimide, the metal of the shield layer 40 tends to easily spread (migrate) in the polyimide.

Meanwhile, in the mounting board 1, the barrier layers 42 sandwiching the electrically conductive layer 41 therebetween are selected from the metal belonging to groups 4 to 10, and the fourth to the sixth periods in the periodic table. Thus, the spread (migration) of the metal of the shield layer 40 in the first cover insulating layer 6 and the second cover insulating layer 31 whose materials are the polyimide can be suppressed.

The barrier layer 42 is preferably one metal selected from the group consisting of titanium, chromium, nickel, palladium, and tantalum. Thus, the spread (migration) of the metal for the barrier layer 42 in the first cover insulating layer 6 and the second cover insulating layer 31 whose materials are the polyimide can be suppressed. As a result, both the adhesive properties and the shield properties of the shield layer 40 can be surely achieved.

The plurality of wires 9 include the ground wire 15, and the ground wire 15 is disposed on the upper surface (one side in the thickness direction) of the base insulating layer 4, so that there is no need for separately providing a layer for the ground wire 15. As a result, a reduction in thickness of the mounting board 1 can be achieved.

The metal that is the material for the barrier layer 42 has lower volume resistivity than the stainless steel, so that the shield layer 40 can be efficiently grounded in a structure of bringing the barrier layer 42 (the first barrier layer 42A) into contact with the ground wire 15.

The mounting board 1 is an adhesive-less FPC in which of the plurality of layers (the base insulating layer 4, the conductive pattern 5, the first cover insulating layer 6, the shield layer 40, and the second cover insulating layer 31), the layers that are next to each other in the up-down direction adhere to each other without an adhesive. Thus, a reduction in thickness of the mounting board 1 can be achieved.

Also, the barrier layer 42 is selected from the above-described metal, and excellent adhesive properties of the shield layer 40 can be ensured, so that the shield layer 40 can surely adhere to the first cover insulating layer 6 and the second cover insulating layer 31 without using the adhesive, and the adhesive-less mounting board 1 can be achieved.

The mounting board 1 can achieve both excellent adhesive properties and excellent shield properties with respect to the electromagnetic waves of the shield layer 40, so that the mounting board 1 can be preferably used as the imaging element-mounting board.

The imaging device 20 includes the mounting board 1. Thus, both excellent adhesive properties and excellent shield properties with respect to the electromagnetic waves of the shield layer 40 can be achieved.

Modified Example

In modified examples, the same reference numerals are provided for members and steps corresponding to each of those in one embodiment, and their detailed description is omitted.

In one embodiment, as the flexible wiring circuit board of the present invention, the imaging element-mounting board 1 (the mounting board 1) for mounting the imaging element 21 is described. However, the use of the flexible wiring circuit board is not limited to this. For example, the flexible wiring circuit board is preferably used for various uses that require both excellent adhesive properties and excellent shield properties with respect to the electromagnetic waves of the shield layer such as the FPC used in smart phones, personal computers, game machines, or the like.

As shown in FIG. 2, in the mounting board 1, the wire 9 includes the ground wire 15. However, the use of the wire 9 is not limited to this and may not include the ground wire 15. That is, the wire 9 can also consist of the connecting wire 14.

In the mounting board 1, the shield layer 40 is electrically connected to the ground wire 15. However, the use of the shield layer 40 is not limited to this, and the shield layer 40 may not be electrically connected to the ground wire 15. Meanwhile, in view of shield properties, as in the above-described embodiment, preferably, the shield layer 40 is electrically connected to the ground wire 15.

In the mounting board 1, the outer shape of the shield layer 40 is the same as that of the first cover insulating layer 6, and the shield layer 40 is collectively in contact with the entire upper surface of the first cover insulating layer 6 and the entire upper surface of the ground wire 15 that is exposed from the ground opening portion 16. However, the shape of the shield layer 40 is not particularly limited, as long as the shield properties can be ensured.

For example, in consideration of electrical properties (for example, impedance adjustment of the wire or the like) of the mounting board 1, the shield layer 40 can be subjected to patterning as long as the effect of the present invention is not damaged.

When the shield layer 40 is subjected to the pattering, the area of the shield layer 40 with respect to 100% of the area of the projected surface when the mounting board 1 is projected in the thickness direction is, for example, 60% or more, preferably 80% or more, and for example, 99% or less.

To form the shield layer 40 that is subjected to the pattering, first, as shown in FIGS. 3A to 4D, the shield layer 40 in a sheet shape is formed on the entire upper surface of the first cover insulating layer 6 in the same manner as that of the metal supporting body preparing step, the base insulating layer forming step, the conductive pattern forming step, the first cover insulating layer forming step, and the shield layer forming step described above.

Next, the shield layer 40 is subjected to the pattering by a known etching method.

For example, after a known photosensitive dry film resist (not shown) is disposed on the entire upper surface of the second barrier layer 42B, the photosensitive dry film resist is exposed to light and developed via a photomask (not shown), and the photosensitive dry film resist (not shown) is open so that of the shield layer 40, an unnecessary part (part that needs to be removed) is exposed. Then, a part of the shield layer 40 that is exposed from the opening of the photosensitive dry film resist (not shown) is removed by an etching solution appropriate for the etching of each of the metals of the shield layer 40, so that the shield layer 40 is subjected to the patterning.

In the mounting board having the shield layer 40 that is subjected to the pattering, both excellent adhesive properties and excellent shield properties of the shield layer 40 can be achieved, and the improvement of the electrical properties of the mounting board 1 can be achieved.

Meanwhile, as in the above-described embodiment, in view of shield properties, the embodiment in which the outer shape of the shield layer 40 is the same as that of the first cover insulating layer 6, and the shield layer 40 is collectively formed on the entire upper surface of the first cover insulating layer 6 and the entire upper surface of the ground wire 15 that is exposed from the ground opening portion 16 (that is, the embodiment in which the area of the shield layer 40 with respect to 100% of the area of the projected surface in the thickness direction of the mounting board 1 is 100%) is more preferable.

The mounting board 1 is the adhesive-less FPC in which the layers that are next to each other in the up-down direction adhere to each other without the adhesive. However, the mounting board 1 is not limited to this. In the mounting board 1, an adhesive layer can be also provided between the layers that are next to each other in the up-down direction. Meanwhile, in view of reduction in thickness, as in the above-described embodiment, preferably, the mounting board 1 is an adhesive-less FPC.

As shown in FIG. 2, in the mounting board 1, the conductive pattern 5 (the plurality of wires 9) and the first cover insulating layer 6 are in direct contact with each other. However, the mounting board 1 is not limited to this. For example, another layer may be also disposed between the conductive pattern 5 and the first cover insulating layer 6.

Figure 6:
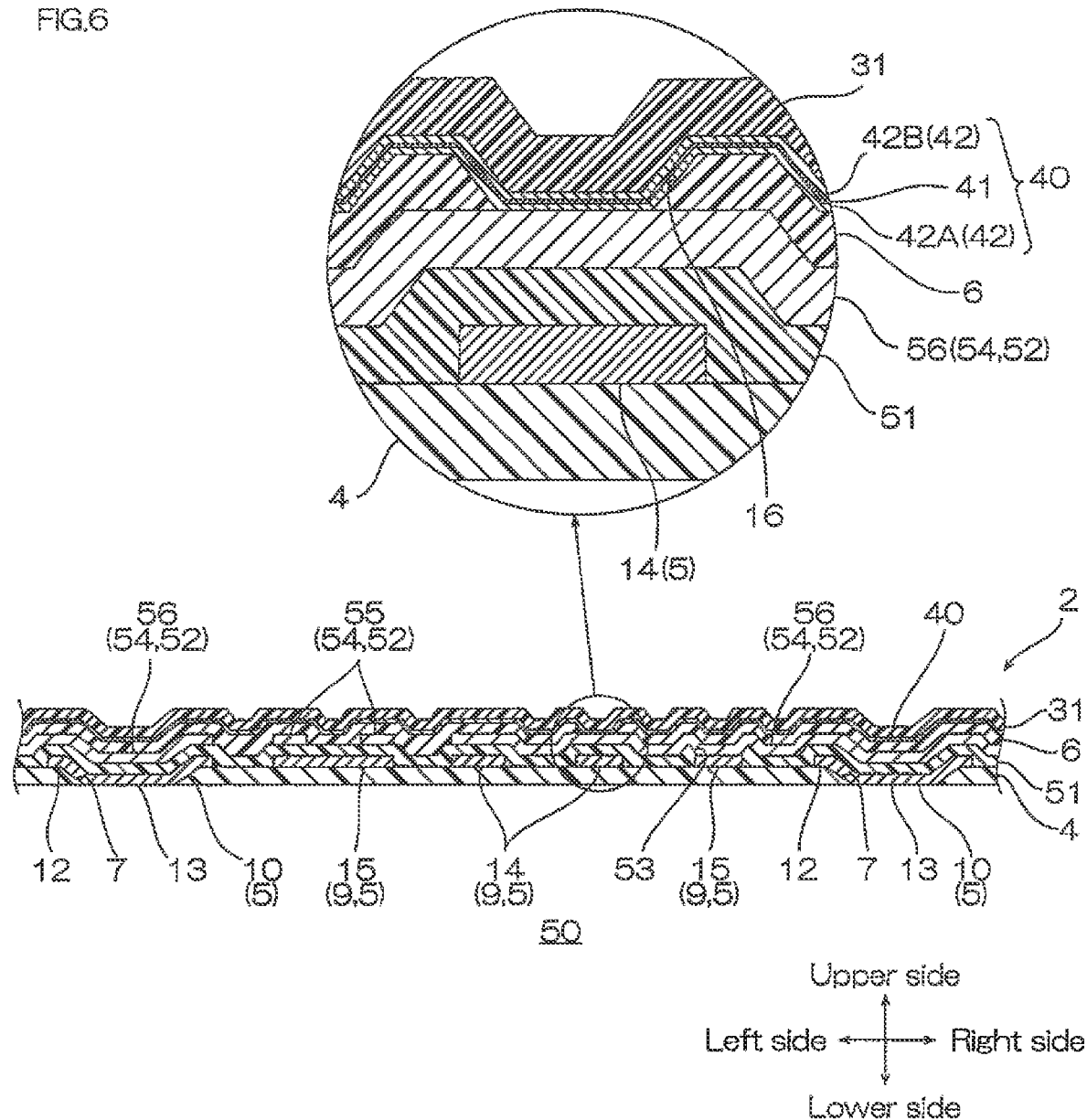
FIG. 6 shows a cross-sectional view of another embodiment (embodiment including a third cover insulating layer and a second conductive pattern) of a flexible wiring circuit board of the present invention.

As shown in FIG. 6, for example, in a mounting board 50 that is another embodiment of the flexible wiring circuit board, a third cover insulating layer 51 (one example of a fourth insulating layer) and a second conductive pattern 52 that are disposed between the conductive pattern 5 and the first cover insulating layer 6 are provided in the up-down direction (thickness direction).

That is, the mounting board 50 sequentially includes the base insulating layer 4, the conductive pattern 5, the third cover insulating layer 51, the second conductive pattern 52, the first cover insulating layer 6, the shield layer 40, and the second cover insulating layer 31 upwardly (one example of one side in the thickness direction). In the following, to clearly distinguish the conductive pattern 5 from the second conductive pattern 52, the conductive pattern 5 is defined as a first conductive pattern 5, the wire 9 is defined as a first wire 9, the connecting wire 14 is defined as a first connecting wire 14, and the ground wire 15 is defined as a first ground wire 15.

The third cover insulating layer 51 is disposed at the upper side of the base insulating layer 4 and the first conductive pattern 5 so as to cover the first conductive pattern 5. At least a part of the third cover insulating layer 51 is disposed at the upper side (one side in the thickness direction) of the first conductive pattern 5 (the plurality of imaging element connecting terminals 10, the plurality of external component connecting terminals 11, and the plurality of first wires 9), and in direct contact with the first conductive pattern 5 (the plurality of imaging element connecting terminals 10, the plurality of external component connecting terminals 11, and the plurality of first wires 9).

A ground opening portion 53 is formed in the third cover insulating layer 51. The ground opening portion 53 is formed corresponding to the first ground wire 15. The ground opening portion 53 passes through the third cover insulating layer 51 in the up-down direction, and exposes the upper surface of the first ground wire 15.

Examples of a material for the third cover insulating layer 51 include the same insulating materials as those of the base insulating layer 4 described above. Preferably, the polyimide is used. The range of the thickness of the third cover insulating layer 51 is, for example, the same as that of the thickness of the first cover insulating layer 6 described above.

The second conductive pattern 52 is disposed at the upper side (one side in the thickness direction) of the third cover insulating layer 51 so as to be in contact with the upper surface of the third cover insulating layer 51. The second conductive pattern 52 includes a plurality of imaging element connecting terminals (not shown), a plurality of external component connecting terminals (not shown), and a plurality of second wires 54.

The plurality of imaging element connecting terminals (not shown) and the plurality of external component connecting terminals (not shown) are formed so as to be exposed from a plurality of opening portions (not shown) that are formed in the base insulating layer 4 and the third cover insulating layer 51.

The plurality of second wires 54 include a plurality of second connecting wires 55 and a plurality of second ground wires 56.

The plurality of second connecting wires 55 are provided corresponding to the plurality of imaging element connecting terminals and the plurality of external component connecting terminals so as to connect them. The plurality of second ground wires 56 are provided corresponding to the plurality of first ground wires 15. The second ground wires 56 are brought into contact with the first ground wires 15 via the ground opening portion 53 to be electrically connected thereto.

Examples of a material for the second conductive pattern 52 include the same metal materials as those of the first conductive pattern 5 described above. Preferably, the copper is used. The range of the thickness of the second conductive pattern 52 is, for example, the same as that of the thickness of the first conductive pattern 5 described above.

The first cover insulating layer 6 is disposed at the upper side of the third cover insulating layer 51 and the second conductive pattern 52 so as to cover the second conductive pattern 52. The ground opening portion 16 exposes a part of the upper surface of the second ground wire 56. The shield layer 40 is brought into contact with the second ground wire 56 via the ground opening portion 16, and is electrically connected to the second ground wire 56. That is, the shield layer 40 is electrically connected to the first ground wire 15 via the second ground wire 56.

The mounting board 50 includes the plurality of first wires 9 and the plurality of second wires 54, so that the number of the wire can be increased, and the improvement of a degree of freedom in design of the mounting board 50 can be achieved. In the mounting board, the number of the insulating layer and the wire disposed between the conductive pattern 5 and the first cover insulating layer 6 is not particularly limited, and the insulating layer and the wire may be further provided in addition to the third cover insulating layer 51 and the second wire 54. Meanwhile, in view of reduction in thickness, the mounting board 1 is preferable.

As shown in FIG. 5, in the imaging device 20 of one embodiment, the imaging element 21 is flip-chip mounted on the mounting board 1. Alternatively, for example, though not shown, the imaging element 21 can be also mounted on the mounting board 1 by wire bonding.

In each of the modified examples described above, the same function and effect as that of one embodiment can be achieved.

EXAMPLES

Next, the present invention is further described based on Production Examples, Comparative Production Examples, Examples, and Comparative Examples. The present invention is however not limited by these Production Examples, Comparative Production Examples, Examples, and Comparative Examples. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Example 1

As shown in FIG. 3A, the metal supporting body 19 having a thickness of 18 µm and made from stainless steel was prepared.

Next, a polyimide precursor solution was applied to the upper surface of the metal supporting body 19 to be next dried at 80° C. for 10 minutes, so that a base film (polyimide precursor film) was formed. Subsequently, the base film was exposed to light via a photomask to be subsequently developed. Thereafter, the base film was heated (cured) at 360° C. for one hour under a nitrogen atmosphere, so that the base insulating layer 4 having the imaging element opening portion 7 and the external component opening portion 8, made from a polyimide, and having a thickness of 5 µm was formed.

As shown in FIG. 3B, thereafter, the conductive pattern 5 having a thickness of 3 µm and made from copper was formed on the upper surface of the base insulating layer 4 and a portion that was exposed from the imaging element opening portion 7 and the external component opening portion 8 on the upper surface of the metal supporting body 19 by an additive method.

As shown in FIG. 3C, thereafter, the polyimide precursor solution was applied to the upper surfaces of the base insulating layer 4 and the conductive pattern 5 to be next dried at 80° C. for 10 minutes, so that a cover film (polyimide precursor film) was formed. Subsequently, the cover film was exposed to light via a photomask to be subsequently developed. Thereafter the cover film was heated at 360° C. for one hour under a nitrogen atmosphere, so that the first cover insulating layer 6 having the ground opening portion 16, made from a polyimide, and having a thickness of 3 µm was obtained.

As shown in FIG. 4D, thereafter, the first barrier layer 42A having a thickness of 0.02 µm and made from chromium was formed on the upper surface of the first cover insulating layer 6 and a portion that was exposed from the ground opening portion 16 on the upper surface of the ground wire 15 by sputtering. Next, the electrically conductive layer 41 having a thickness of 0.1 µm and made from copper was formed on the upper surface of the first barrier layer 42A by sputtering. Next, the second barrier layer 42B having a thickness of 0.02 µm and made from chromium was formed on the upper surface of the electrically conductive layer 41 by sputtering. In this manner, the shield layer 40 was formed.

Subsequently, as shown in FIG. 4E, the polyimide precursor solution was applied to the upper surface of the second barrier layer 42B to be next dried at 80° C. for 10 minutes, so that a cover film (polyimide precursor film) was formed. Subsequently, the cover film was exposed to light to be subsequently developed. Thereafter, the cover film was heated (cured) at 360° C. for one hour under a nitrogen atmosphere, so that the second cover insulating layer 31 having a thickness of 3.0 µm and made from a polyimide was formed.

As shown in FIG. 4F, the metal supporting body 19 was removed by a chemical etching method in which an etching solution made of a ferric chloride aqueous solution was sprayed from the lower side. In this manner, the entire lower surface of the base insulating layer 4 was exposed.

As described above, the mounting board 1 including the base insulating layer 4, the conductive pattern 5, the first cover insulating layer 6, the shield layer 40, and the second cover insulating layer 31 was obtained.

Example 2

The mounting board 1 was obtained in the same manner as that of Example 1, except that each of the first barrier layer 42A and the second barrier layer 42B was changed to a thin film (sputtering film) having a thickness of 0.03 µm and made from titanium.

Example 3

The mounting board 1 was obtained in the same manner as that of Example 1, except that the second barrier layer 42B was changed to a thin film (sputtering film) having a thickness of 0.08 µm and made from nickel.

Comparative Example 1

The mounting board 1 was obtained in the same manner as that of Example 1, except that each of the first barrier layer 42A and the second barrier layer 42B was changed to a thin film (sputtering film) having a thickness of 0.05 µm and made from stainless steel (SUS).

Comparative Example 2

The mounting board 1 was obtained in the same manner as that of Example 1, except that each of the first barrier layer 42A and the second barrier layer 42B was not formed. That is, the electrically conductive layer 41 was formed on the upper surface of the first cover insulating layer 6 and a portion that was exposed from the ground opening portion 16 on the upper surface of the ground wire 15, and the second cover insulating layer 31 was formed on the upper surface of the electrically conductive layer 41.

Each of the layer structures and the thickness of Examples and Comparative Examples is described in Table 1.

[Evaluation]

The following items were evaluated as for each of the mounting boards 1 of Examples and Comparative Examples. The results are shown in Table 1.

<Shield Properties>

The shield properties of the shield layer 40 of each of the mounting boards 1 of Examples and Comparative Examples were measured by a KEC method. The shield properties were evaluated in accordance with the following criteria.

Good: −40 db or less (1 GHz)

Poor: above −40 db and −30 db or less (1 GHz)

Bad: above −30 db (1 GHz)

<Adhesive Properties>

The adhesive properties of the shield layer 40 of each of the mounting boards 1 of Examples and Comparative Examples were measured in conformity with JIS K-5600-5-6 (crosscut method). To be specific, after cuts (six cuts in length and six cuts in width) were provided in the second cover insulating layer 31 so as to form a grid pattern by using a predetermined cutting tool and spacer, a pressure-sensitive adhesive tape having a length of about 75 mm was attached to a portion cut into a grid pattern in the second cover insulating layer 31. Next, the pressure-sensitive adhesive tape was securely rubbed with a finger so that the second cover insulating layer 31 can be transparently seen through the pressure-sensitive adhesive tape, and the pressure-sensitive adhesive tape was appropriately brought into contact with the second cover insulating layer 31. Thereafter, within five minutes after the attachment of the pressure-sensitive adhesive tape, the pressure-sensitive adhesive tape was surely peeled from the second cover insulating layer 31 at an angle (peeling angle of about 120°) in which the bending angle of the pressure-sensitive adhesive tape was close to 60° for 0.5 seconds to 1.0 second. Thereafter, the test portion was classified into six categories (0 to 5) compared to the views shown in Table 1 in JIS K-5600-5-6 8.3. The adhesive properties were evaluated by the following criteria.

Good: Category 0 (no peeling)
Poor: Category 1 to 2
Bad: Category 3 to 5

TABLE 1

| no. | | | Ex. 1 | Ex. 2 | Ex. 3 | Comp. Ex. 1 | Comp. Ex. 2 |
|---|---|---|---|---|---|---|---|
| Second Cover Insulating Layer | | Thickness (μm) | 3.0 | 3.0 | 3.0 | 3.0 | 3.0 |
| Shield Layer | Second Barrier Layer | Material | Chromium | Titanium | Nickel | SUS | — |
| | | Thickness (μm) | 0.02 | 0.03 | 0.08 | 0.05 | — |
| | Electrically Conductive Layer | Material | Copper | Copper | Copper | Copper | Copper |
| | | Thickness (μm) | 0.1 | 0.1 | 0.1 | 0.1 | 0.1 |
| | First Barrier Layer | Material | Chromium | Titanium | Chromium | SUS | — |
| | | Thickness (μm) | 0.02 | 0.03 | 0.02 | 0.05 | — |
| First Cover Insulating Layer | | Thickness (μm) | 3 | 3 | 3 | 3 | 3 |
| Conductive Pattern | | Thickness (μm) | 3 | 3 | 3 | 3 | 3 |
| Base Insulating Layer | | Thickness (μm) | 5 | 5 | 5 | 5 | 5 |
| Total Sum of Thickness of Shield Layer and Second Cover Insulating Layer | | Thickness (μm) | 3.14 | 3.16 | 3.20 | 3.20 | 3.10 |
| Thickness of Mounting Board | | Thickness (μm) | 14.14 | 14.16 | 14.20 | 14.20 | 14.10 |
| Evaluation | Shield Properties | | Good | Good | Good | Poor | Good |
| | Adhesive Properties | | Good | Good | Good | Poor | Bad |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The flexible wiring circuit board of the present invention can be used in various industrial products, and for example, can be preferably used for imaging devices, smart phones, personal computers, and game machines.

DESCRIPTION OF REFERENCE NUMERALS

1 Mounting board (imaging element-mounting board)
4 Base insulating layer
6 First cover insulating layer
9 Wire
20 Imaging device
21 Imaging element
31 Second cover insulating layer
40 Shield layer
41 Electrically conductive layer
42 Barrier layer
50 Mounting board
51 Third cover insulating layer
54 Second wire

The invention claimed is:

1. A flexible wiring circuit board having flexibility comprising:
a first insulating layer,
a wire disposed at one side in a thickness direction of the first insulating layer,
a second insulating layer disposed at one side in the thickness direction of the wire,
a shield layer disposed at one side in the thickness direction of the second insulating layer, and
a third insulating layer disposed at one side in the thickness direction of the shield layer,
wherein
the shield layer includes
an electrically conductive layer and
two barrier layers sandwiching the electrically conductive layer therebetween in the thickness direction;
the electrically conductive layer is selected from a metal belonging to a group 11, and the fourth period and the fifth period in the periodic table;
each of the two barrier layers is selected from a metal belonging to groups 4 to 10, and the fourth to the sixth periods in the periodic table;
each of the materials for the second insulating layer and the third insulating layer is a polyimide;
the electrically conductive layer has a thickness of 0.05 μm or more and 1.0 μm or less; and
each of the two barrier layers has a thickness of 0.01 μm or more and 0.05 μm or less.

2. The flexible wiring circuit board according to claim 1, wherein
each of the two barrier layers is one metal selected from the group consisting of titanium, chromium, nickel, palladium, and tantalum.

3. The flexible wiring circuit board according to claim 1, wherein
the wire includes a ground wire, and
the shield layer is electrically connected to the ground wire by bringing one of the two barrier layers into contact with the ground wire.

4. The flexible wiring circuit board according to claim 1, wherein the wire is in direct contact with the first insulating layer,
the second insulating layer is in direct contact with the wire,
one of the two barrier layers that is positioned at the other side in the thickness direction with respect to the electrically conductive layer is in direct contact with the second insulating layer,
the electrically conductive layer is in direct contact with the barrier layer that is positioned at the other side in the thickness direction with respect to the electrically conductive layer,
another of the two barrier layers that is positioned at one side in the thickness direction with respect to the electrically conductive layer is in direct contact with the electrically conductive layer, and
the third insulating layer is in direct contact with the other of the two barrier layers that is positioned at one side in the thickness direction with respect to the electrically conductive layer.

5. The flexible wiring circuit board according to claim 1 further comprising:
a fourth insulating layer and a second wire disposed between the wire and the second insulating layer in the thickness direction, wherein
the fourth insulating layer is disposed at one side in the thickness direction of the wire and
the second wire is disposed at one side in the thickness direction of the fourth insulating layer.

6. The flexible wiring circuit board according to claim 1 comprising an imaging element-mounting board for mounting an imaging element.

7. An imaging device comprising:
the flexible wiring circuit board according to claim 1 and
an imaging element mounted on the flexible wiring circuit board.

8. The flexible wiring circuit board according to claim 1, wherein each of the second insulating layer and the third insulating layer has a thickness in a range of 1 μm or more and 5 μm or less.

9. The flexible wiring circuit board according to claim 1, wherein the material for the first insulating layer is a polyimide.

10. The flexible wiring circuit board according to claim 1, wherein the first insulating layer has a thickness in a range of 1 μm or more and 8 μm or less.

* * * * *